US012696610B2

(12) United States Patent
Sam et al.

(10) Patent No.: US 12,696,610 B2
(45) Date of Patent: Jul. 28, 2026

(54) SELF-ADHERENT FLEXIBLE THIN FILM STACKS AND PHOTOVOLTAIC DEVICES INCLUDING SAME

(71) Applicant: Solaires Entreprises Inc., Victoria (CA)

(72) Inventors: Mahshid Sam, Victoria (CA); Alfonso Fabian de la Fuente Sanchez, Victoria (CA)

(73) Assignee: Solaires Entreprises Inc., Victoria (CA)

( * ) Notice: Subject to any disclaimer, the term of this patent is extended or adjusted under 35 U.S.C. 154(b) by 538 days.

(21) Appl. No.: 18/109,819

(22) Filed: Feb. 14, 2023

(65) Prior Publication Data

US 2024/0276745 A1 Aug. 15, 2024

(51) Int. Cl.
| | |
|---|---|
| *H10K 39/18* | (2026.01) |
| *H01G 9/20* | (2006.01) |
| *H10K 85/50* | (2023.01) |
| *H10K 85/60* | (2023.01) |
| *H10K 71/00* | (2023.01) |
| *H10K 77/10* | (2023.01) |

(52) U.S. Cl.
CPC ........... *H10K 39/18* (2023.02); *H01G 9/2068* (2013.01); *H10K 85/50* (2023.02); *H10K 85/633* (2023.02); *H01G 9/2095* (2013.01); *H10K 71/851* (2023.02); *H10K 77/111* (2023.02); *H10K 85/624* (2023.02)

(58) Field of Classification Search
CPC ....... H10F 19/35; H10F 19/40; H10K 77/111; H10K 39/18; H10P 72/74
See application file for complete search history.

(56) References Cited

U.S. PATENT DOCUMENTS

| | | | | |
|---|---|---|---|---|
| 9,029,693 | B2 | 5/2015 | Li | |
| 2017/0170355 | A1* | 6/2017 | Stan ...................... | H10F 77/169 |
| 2019/0181290 | A1* | 6/2019 | Hsu ........................ | H10K 85/50 |
| 2020/0058819 | A1* | 2/2020 | Kirner ................... | H10F 77/244 |
| 2021/0151259 | A1* | 5/2021 | Lindström ........... | H01G 9/2077 |
| 2023/0129154 | A1* | 4/2023 | Gotanda ............... | H10F 19/902 |
| | | | | 136/244 |
| 2024/0266453 | A1* | 8/2024 | Zhang ................... | H10F 10/142 |

FOREIGN PATENT DOCUMENTS

| | | | | |
|---|---|---|---|---|
| EP | 4404712 A1 * | 7/2024 | ............. | H10K 30/81 |

OTHER PUBLICATIONS

Color-Tuned Perovskite Films Prepared for Efficient Solar Cell Applications, The Journal of Physical Chemistry C, vol. 120, Issue 1 (Year: 2016).*

* cited by examiner

*Primary Examiner* — Christine S. Kim
*Assistant Examiner* — Andrew Victor Prostor
(74) *Attorney, Agent, or Firm* — Baumgartner Patent Law, LLC; Marc Baumgartner

(57) ABSTRACT

A flexible photovoltaic thin film device is provided, the flexible photovoltaic thin film device comprising: a support film; wires, the support film retaining the wires, the wires terminating in at least one contact point; and a plurality of flexible photovoltaic thin film stacks adhered on the support film and electrically connected to the wires, each flexible photovoltaic thin film stack comprising, in order, an outer protective layer, an outer electrode layer, an electron transport layer, a semi-conductor perovskite layer, a hole transport layer, an inner electrode layer and an adherent layer.

11 Claims, 9 Drawing Sheets

27210
27211
27212
27213
27214
27215
27316
27317
27318
27319
27320
27216

27401

27121

27122

27123

27100

27402

27210
27211
27212
27213
27214
27215
27800
27216

27210
27211
27212
27213
27214
27215
27900
27216

SELF-ADHERENT FLEXIBLE THIN FILM STACKS AND PHOTOVOLTAIC DEVICES INCLUDING SAME

FIELD

The present technology is a photovoltaic device that is flexible and can conform to and adhere to a wide range of shapes. More specifically, it is a photovoltaic device with a multiplicity of flexible thin film photovoltaic stacks attached to a support film. The photovoltaic device can be customized to fit a range of spaces.

BACKGROUND

Solar panels work by converting light (electromagnetic radiation) into electricity (electrical potential energy) at an efficiency that ranges from 10% to 30%. The electricity produced by solar panels is "Direct Current" (DC) which needs to be distributed for consumption or stored. Energy consumption is when a device draws energy and uses it. Energy storage is when the energy is stored for example in a battery for later consumption.

Solar panels made of silicon are bulky and rigid, and the installation process requires substantial real estate at a building or land. Many surfaces face the sun for only a few hours of the day, hence for much of the day, the energy generated by the sun is not collected and converted to electricity.

An alternative is to use transparent conducting films (TCFs) in photovoltaics. These are thin films of optically transparent and electrically conductive material. They are an important component in a number of electronic devices including liquid-crystal displays, OLEDs, touchscreens and photovoltaics. While indium tin oxide (ITO) is the most widely used, alternatives include wider-spectrum transparent conductive oxides (TCOs), conductive polymers, metal grids and random metallic networks, carbon nanotubes (CNT), graphene, nanowire meshes and ultra thin metal films. TCFs for photovoltaic applications have been fabricated from both inorganic and organic materials. Inorganic films typically are made up of a layer of transparent conducting oxide (TCO), most commonly indium tin oxide (ITO), fluorine doped tin oxide (FTO) or doped zinc oxide. Organic films are being developed using carbon nanotube networks and graphene, which can be fabricated to be highly transparent to infrared light, along with networks of polymers such as poly(3,4-ethylenedioxythiophene) and its derivatives. Transparent conducting films are typically used as electrodes when a situation calls for low resistance electrical contacts without blocking light (e.g. LEDs, photovoltaics). Transparent materials possess wide band gaps whose energy value is greater than those of visible light. As such, photons with energies below the bandgap value are not absorbed by these materials and visible light passes through. Some applications, such as solar cells, often require a wider range of transparency beyond visible light to make efficient use of the full solar spectrum. Transparent conductive oxides (TCO) are doped metal oxides used in optoelectronic devices such as flat panel displays and photovoltaics (including inorganic devices, organic devices, and dye-sensitized solar cells). Most of these films are fabricated with polycrystalline or amorphous microstructures. Typically, these applications use electrode materials that have greater than 80% transmittance of incident light as well as electrical conductivities higher than 103 S/cm for efficient carrier transport. In general, TCOs for use as thin-film electrodes in solar cells should have a minimum carrier concentration on the order of $10^{20}$ cm$^{-3}$ for low resistivity and a bandgap greater than 3.2 eV to avoid absorption of light over most of the solar spectra. Mobility in these films is typically limited by ionized impurity scattering due to the large amount of ionized dopant atoms and is on the order of 40 cm$^2$/(V·s) for the best performing TCOs. Current transparent conducting oxides used in industry are primarily n-type conductors, meaning their primary conduction is as donors of electrons. This is because electron mobilities are typically higher than hole mobilities, making it difficult to find shallow acceptors in wide band gap oxides to create a large hole population. Suitable p-type transparent conducting oxides are still being researched, though the best of them are still orders of magnitude behind n-type TCOs. The lower carriers' concentration of TCOs with respect to metals shift their plasmonic resonance into the NIR and SWIR range. Randomly conducting networks of wires or metal meshes obtained from templates are new generation transparent electrodes. In these electrodes, nanowire or metal mesh network is a charge collector, while the voids between them are transparent to light. These are obtained from the deposition of silver or copper nanowires, or by depositing metals in templates such as hierarchical patterns of random cracks, leaves venation and grain boundaries etc. These metal networks can be made on flexible substrates and can act as flexible transparent electrodes. For better performance of these conducting network-based electrodes, optimised density of nanowires has to be used as excess density leads to shadowing losses in solar cells, while the lower density of the wires leads to higher sheet resistance and more recombination losses of charge carriers generated in solar cells.

An example of a flexible photovoltaic device is disclosed in U.S. Pat. No. 9,029,693 which is directed to a flexible solar cell photovoltaic module with high light transmittance based on modified substrate, which belongs to the field of thin-film solar cell technology. The objective of the invention to provide a technical solution for a transparent flexible solar cell module and its fabrication method. Technical features include using a stainless steel template to mold a modified polyimide PI substrate (the PI substrate). The PI substrate has light-passing through-holes, including draining holes and convergence holes, through and distributed on the PI substrate, a conductive film layer, and various stacked photoelectric conversion film layers.

SUMMARY

Provided is a flexible photovoltaic thin film device comprising a plurality of stacks of multiple layers of film, including an outer adherent layer that can adhere to a range of different surfaces and both planar and non-planar shapes. The device collects solar energy and converts it to electricity. The device may collect solar energy from either side of the stack of film. The photovoltaic thin film device can be cut to size without damaging the photovoltaics.

In one embodiment, a flexible photovoltaic thin film device is provided, the flexible photovoltaic thin film device comprising: a support film; wires, the support film retaining the wires, the wires terminating in at least one contact point; and a plurality of flexible photovoltaic thin film stacks adhered on the support film and electrically connected to the wires, each flexible photovoltaic thin film stack comprising, in order, an outer protective layer, an outer electrode layer, an electron transport layer, a semi-conductor perovskite layer, a hole transport layer, an inner electrode layer and an adherent layer.

The flexible photovoltaic thin film device may further comprise a second support film, the second support film sandwiching the plurality of flexible photovoltaic thin film stack between the second support film and the support film.

In the flexible photovoltaic thin film device, the support film may include an adhesive backing.

In the flexible photovoltaic thin film device, the support film may include a grid which divides the support film into zones, each zone supporting at least one flexible photovoltaic thin film stack.

In the flexible photovoltaic thin film device, the support film may be polyimide, polyetheretherketone or transparent conductive polyester film.

In the flexible photovoltaic thin film device, the hole transport layer may be 2,2',7,7'-Tetrakis[N,N-di(4-methoxy-phenyl)amino]-9,9'-spiro-bifluorene.

The flexible photovoltaic thin film device may further comprise a sensor layer between the inner electrode layer and the adherent layer.

The flexible photovoltaic thin film device may further comprise a light emitting layer between the inner electrode layer and the adherent layer.

In the flexible photovoltaic thin film device, the perovskite layer may be orange.

The flexible photovoltaic thin film device may further comprise slave contact points which are in electrical communication with the contact point and the wires and are retained on the support film.

In the flexible photovoltaic thin film device each flexible photovoltaic thin film stack may further comprise, in order, a second inner electrode layer, which is adjacent to and in electrical communication with the inner electrode layer, an electron transport layer, a semi-conductor layer, a hole transport layer, an electrode layer, between the inner electrode layer and the adherent layer.

In another embodiment, a method of applying a photovoltaic device to a surface is provided, the method comprising: selecting a flexible photovoltaic thin film device comprising: a support film, the support film including an adhesive backing; wires, which are retained by the support film, the wires terminating in at least one contact point; and a plurality of flexible photovoltaic thin film stacks adhered on the support film and electrically connected to the wires, each flexible photovoltaic thin film stack comprising, in order, an outer protective layer, an outer electrode layer, an electron transport layer, a semi-conductor perovskite layer, a hole transport layer, an inner electrode layer and an adherent layer; and pressing the flexible photovoltaic thin film device onto the surface.

The method may further comprise cutting the flexible photovoltaic thin film device into at least two zones, each zone including at least one flexible photovoltaic stack and a contact point.

The method may further comprise molding the flexible photovoltaic thin film device over a non-planar shape.

The method may further comprise molding the flexible photovoltaic thin film device to the surface of the non-planar shape, wherein the surface is an uneven surface.

4

Figure 3:
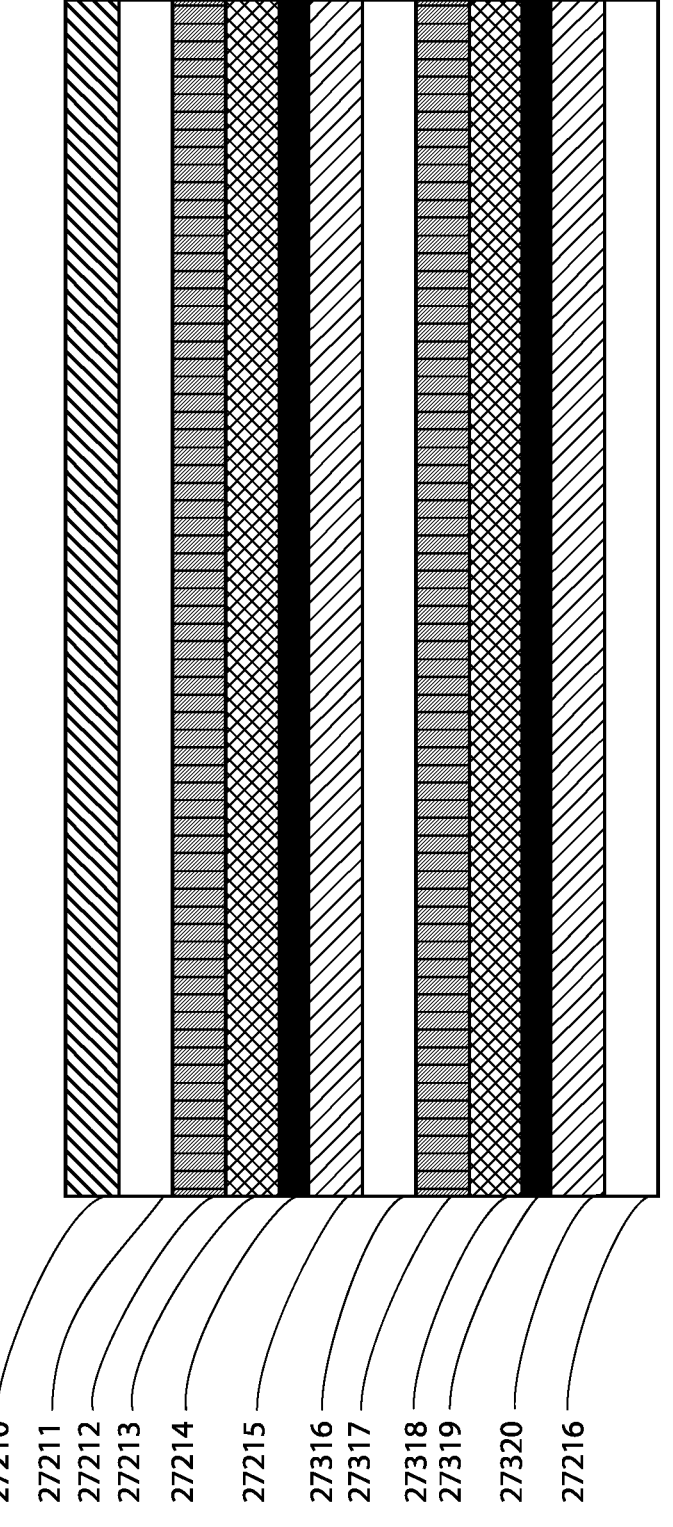

FIG. 3 shows a side cross sectional view of another embodiment of the technology.

Figure 4:
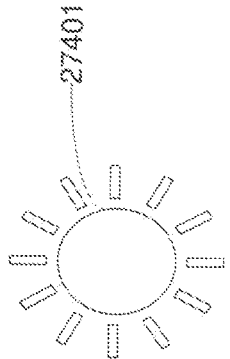
Figure 4:
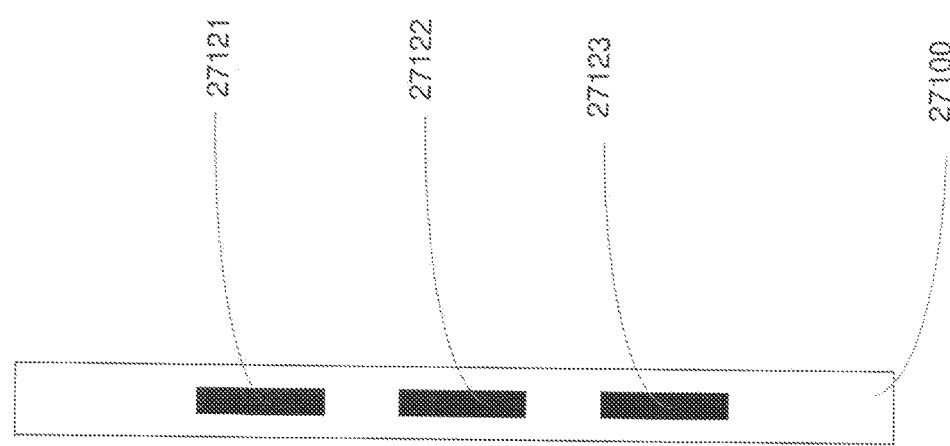
Figure 4:
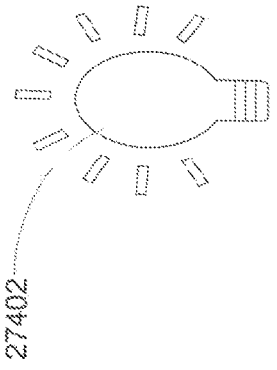

FIG. 4 shows a side view of another embodiment of the photovoltaic device, wherein the semiconductor layer is made of translucent perovskites.

Figure 5:
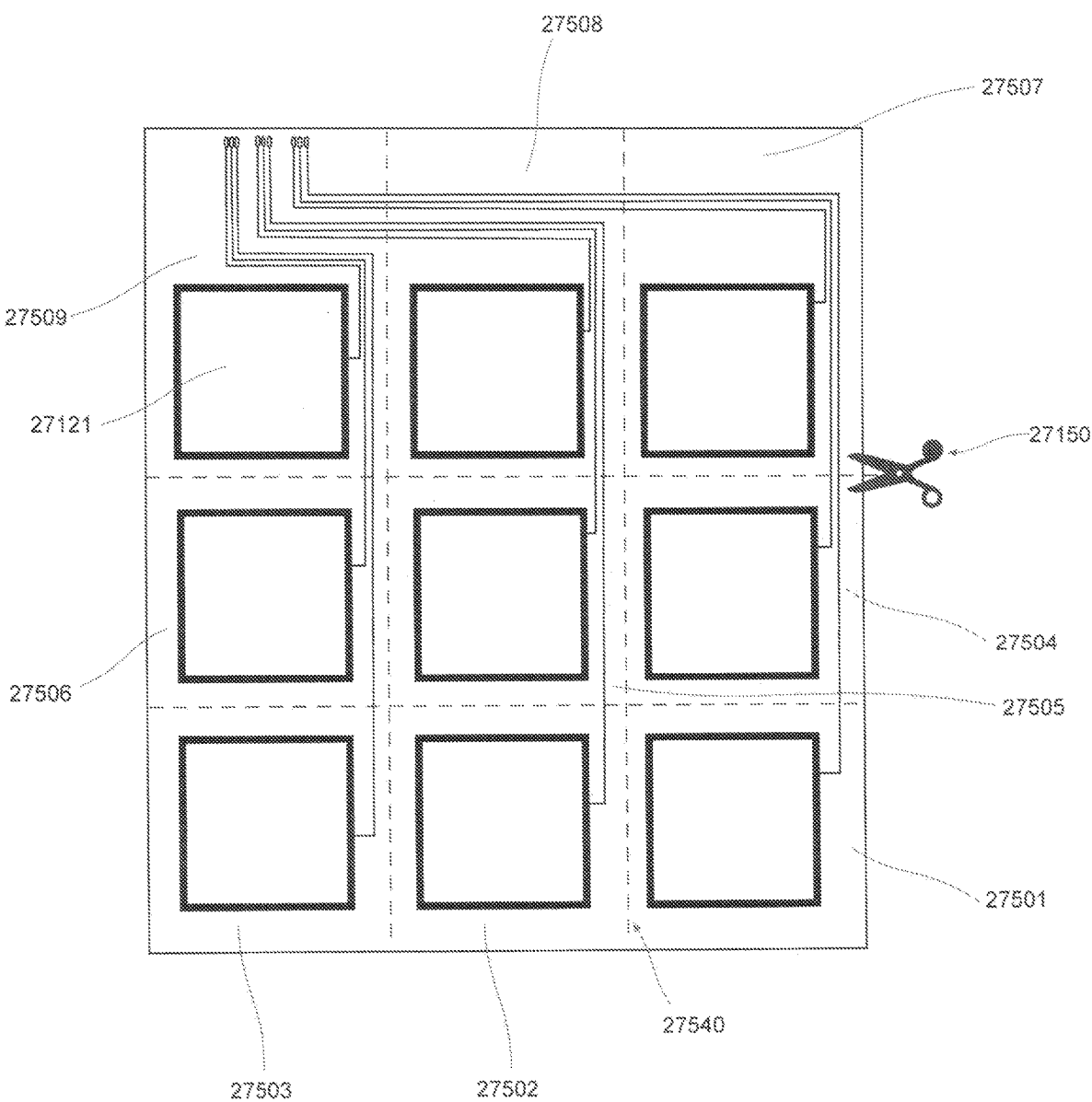

FIG. 5 is a top view of the flexible photovoltaic thin film device of the present technology.

Figure 6:
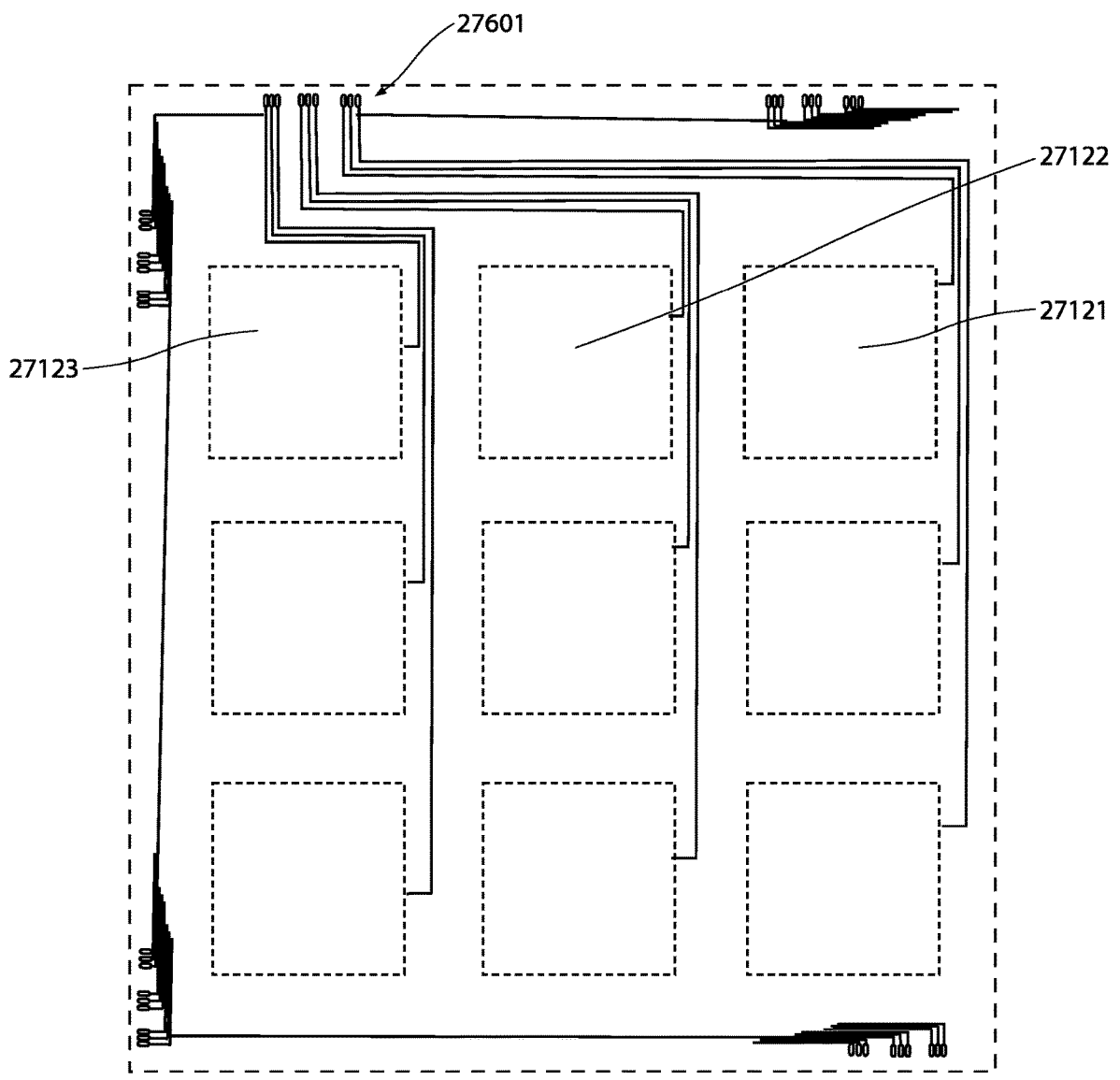

FIG. 6 is a top view of the flexible photovoltaic thin film device of the present technology.

Figure 7:
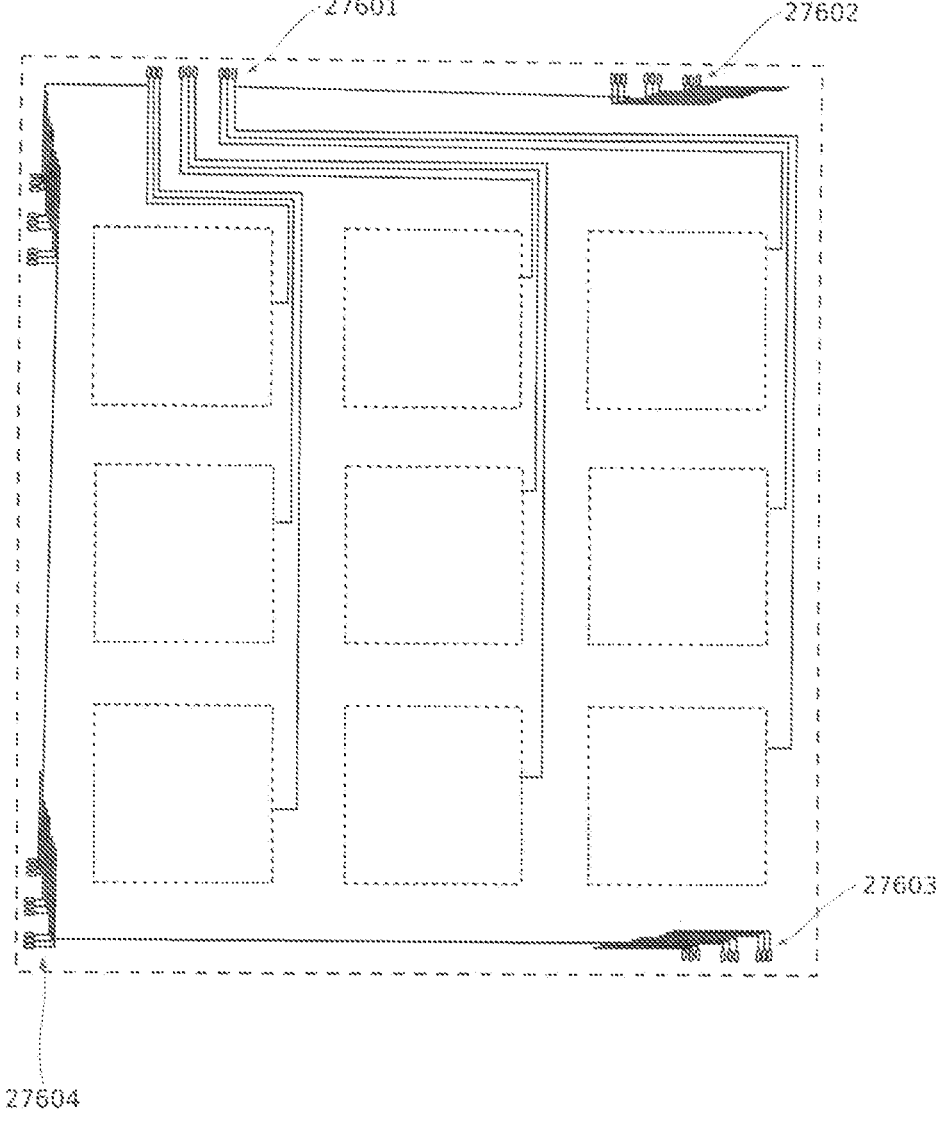

FIG. 7 is a top view of the flexible photovoltaic thin film device of the present technology.

Figure 8:
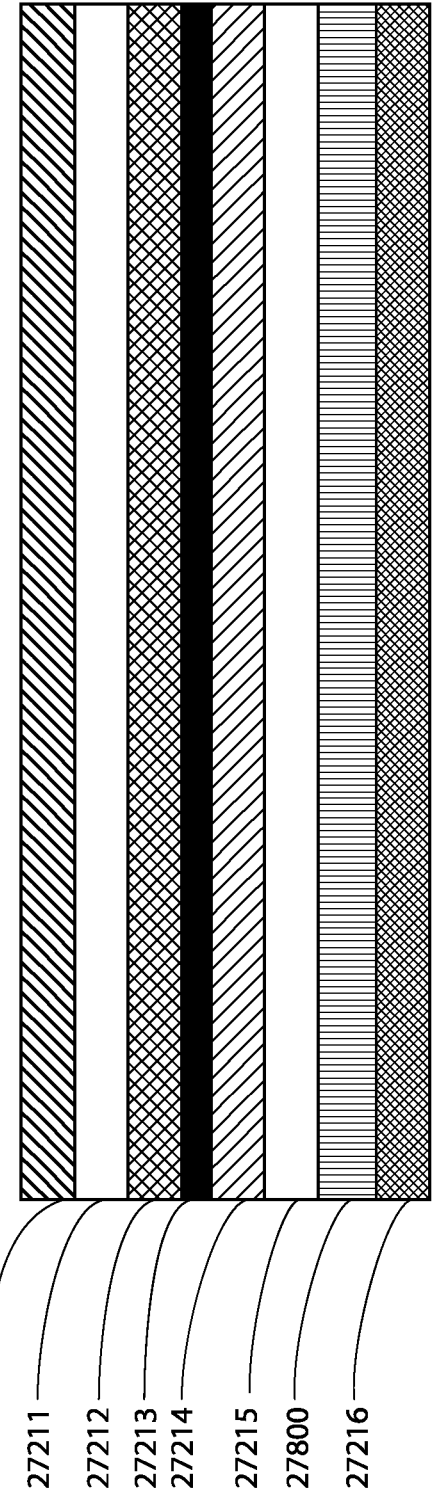

FIG. 8 shows a side view of a multi-layered segment of a photovoltaic thin film stack.

Figure 9:
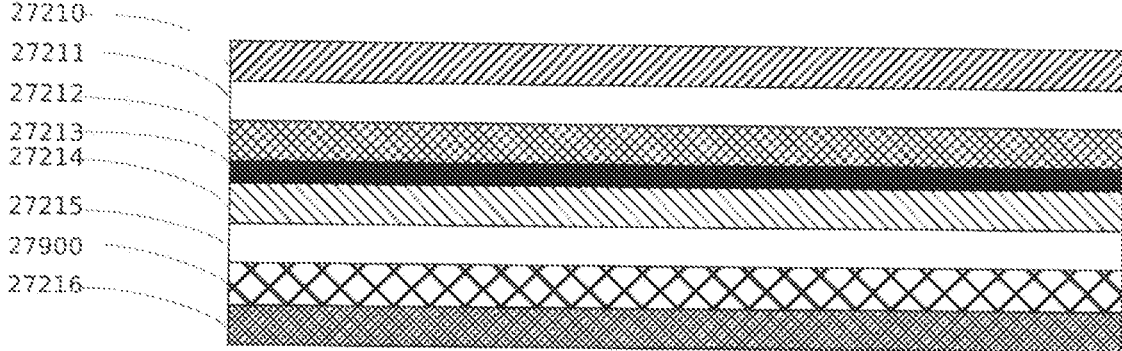

FIG. 9 shows a side view of a multi-layered segment of a photovoltaic thin film stack.

DESCRIPTION

Except as otherwise expressly provided, the following rules of interpretation apply to this specification (written description and claims): (a) all words used herein shall be construed to be of such gender or number (singular or plural) as the circumstances require; (b) the singular terms "a", "an", and "the", as used in the specification and the appended claims include plural references unless the context clearly dictates otherwise; (c) the antecedent term "about" applied to a recited range or value denotes an approximation within the deviation in the range or value known or expected in the art from the measurements method; (d) the words "herein", "hereby", "hereof", "hereto", "hereinbefore", and "hereinafter", and words of similar import, refer to this specification in its entirety and not to any particular paragraph, claim or other subdivision, unless otherwise specified; (e) descriptive headings are for convenience only and shall not control or affect the meaning or construction of any part of the specification; and (f) "or" and "any" are not exclusive and "include" and "including" are not limiting. Further, the terms "comprising," "having," "including," and "containing" are to be construed as open-ended terms (i.e., meaning "including, but not limited to,") unless otherwise noted.

Recitation of ranges of values herein are merely intended to serve as a shorthand method of referring individually to each separate value falling within the range, unless otherwise indicated herein, and each separate value is incorporated into the specification as if it were individually recited herein. Where a specific range of values is provided, it is understood that each intervening value, to the tenth of the unit of the lower limit unless the context clearly dictates otherwise, between the upper and lower limit of that range and any other stated or intervening value in that stated range, is included therein. All smaller sub ranges are also included. The upper and lower limits of these smaller ranges are also included therein, subject to any specifically excluded limit in the stated range.

Unless defined otherwise, all technical and scientific terms used herein have the same meaning as commonly understood by one of ordinary skill in the relevant art. Although any methods and materials similar or equivalent to those described herein can also be used, the acceptable methods and materials are now described.

The present technology is directed to flexible photovoltaic thin film devices which include flexible circuits. These flexible circuits comprise electronic circuits mounted on flexible plastic substrates, such as polyimide, polyetheretherketone (PEEK) or transparent conductive polyester film. In one embodiment, the flexible circuit is a printed silver circuit on polyester. In another embodiment, the electronic circuitry is the same as that used for rigid printed circuit boards. In all embodiments, the resultant photovoltaic device can conform to a desired shape, or to flex during its use.

Figure 1:
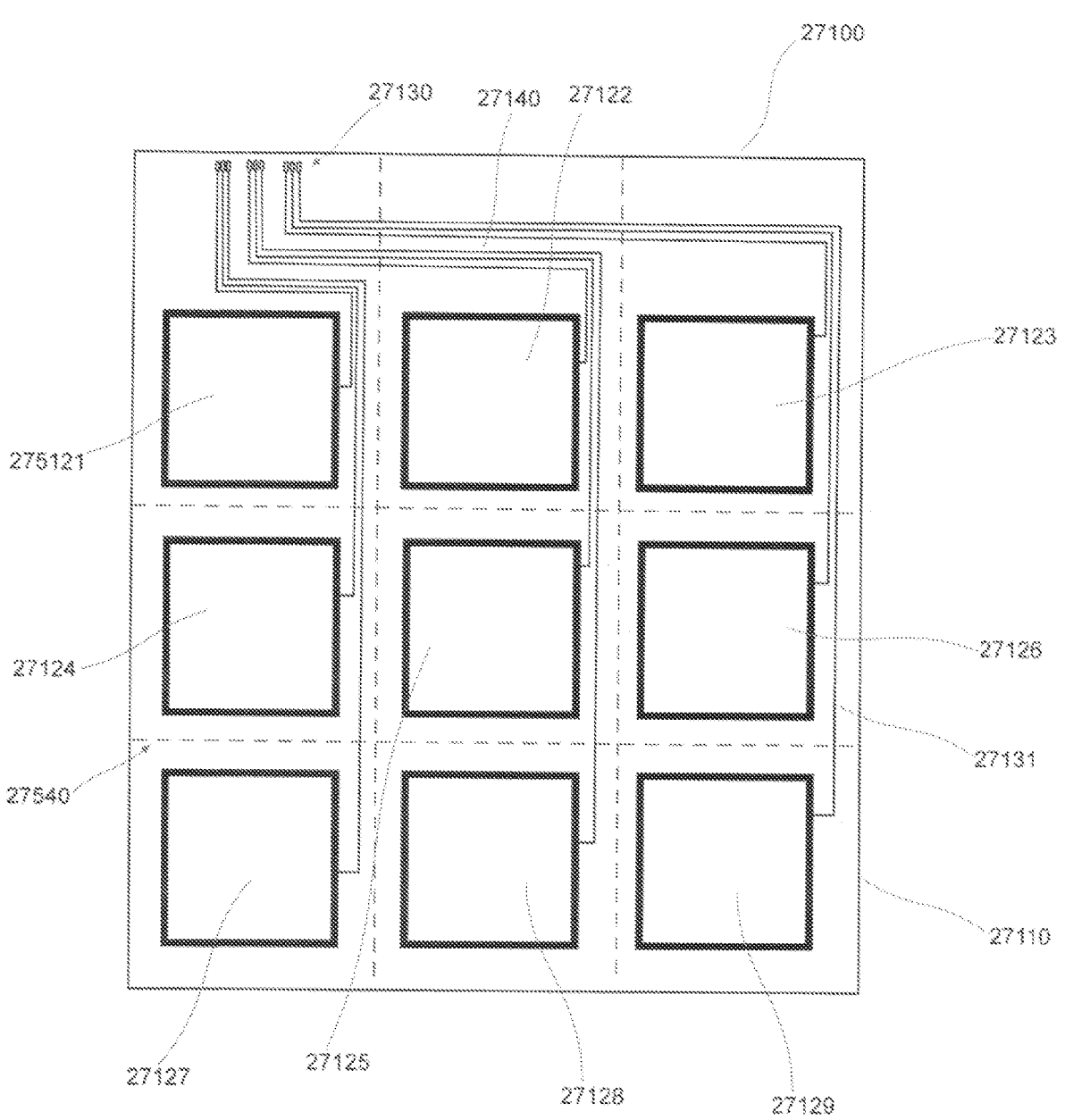
FIG. 1 shows a top view of the flexible photovoltaic thin film device.
Figure 2:
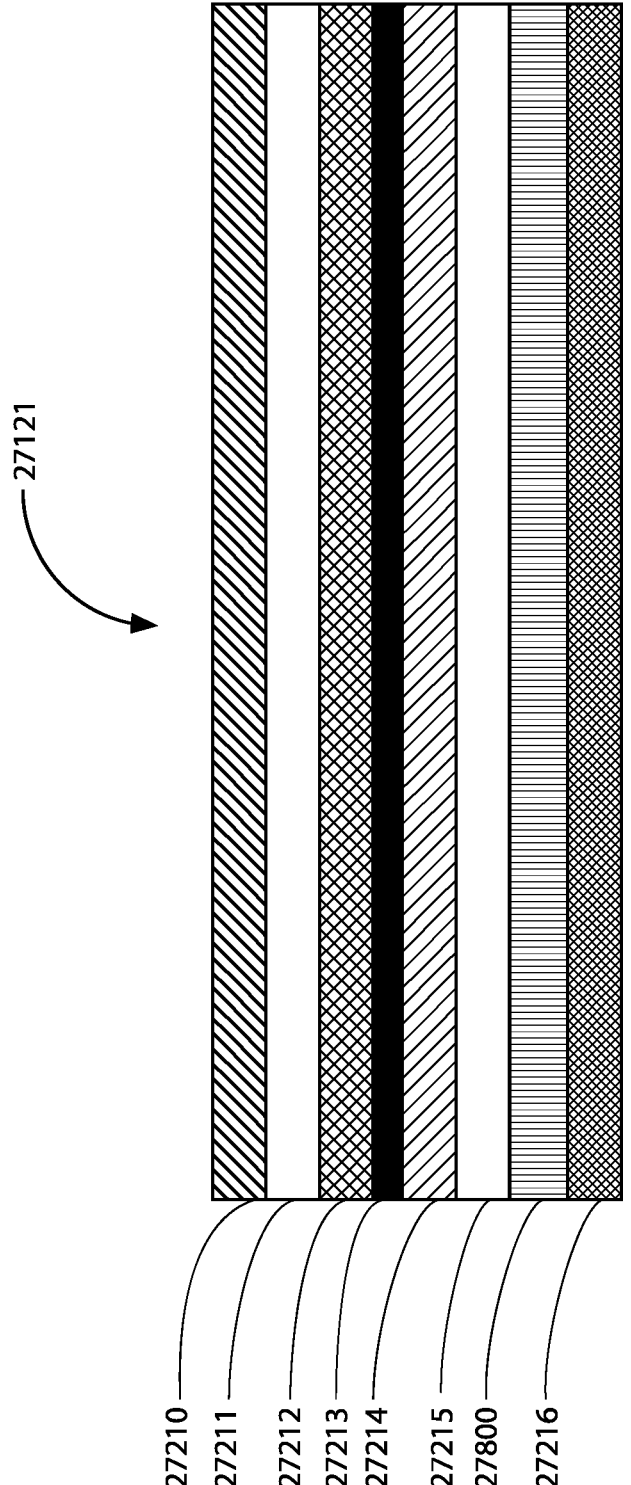
FIG. 2 shows a side view of a multi-layered segment of a thin film stack for use in a flexible photovoltaic thin film device.

FIG. 1 shows a top view of the flexible photovoltaic thin film device of the present technology, generally referred to as 27100, showing multiple multi-layered segments of photovoltaic thin film stacks (27121, 27122, 27123, 27124, 27125, 27126, 27127, 27128, 27129) and master contact points (27130) located in one or more sides of the support film 27110, wherein one or more master contact points (27130) is/are electrically connected to one or more layers. One familiar with the art will appreciate that a master contact point connects to a layer that transports energy, for example the first (27211) and fifth (27215) inner layers of the multiple multi-layered segments of a thin film stack as shown in FIG. 2. One familiar with the art will also appreciate that the master contact point is where a connector with wires will mechanically connect the device to an energy storage or distribution system. One familiar with the art will also appreciate that the contact points can be a type of flat metallic conductors such as trace wires (27140) that are embedded in the support film 27110; wherein the trace wires electrically connect the layers that carry electricity (for example 27211 and 27215 of FIG. 2) to the master contact points (27130). One familiar with the art will appreciate that the trace wires (27140) may work in a configuration of 2 or more cables, the first pair of them carrying positive and negative charge. Each trace wire (27131) is connected to a thin film stack independently. In another embodiment of the technology, a flexible tail is connected to the contact points. For example, a flat flexible cable (FFC) is a miniaturized form of ribbon cable, which is also flat and flexible. The cable usually consists of a flat and flexible plastic film base, with multiple flat metallic conductors bonded to one surface. Often, each end of the cable is reinforced with a stiffener to make insertion easier or to provide strain relief. The stiffener makes the end of the cable slightly thicker. In another embodiment of the technology, the contact points connect to a second flexible photovoltaic thin film device. The support film 27110 has an adhesive backing, allowing for it to be attached to a range of surfaces. As the support film 27110 is flexible, and the photovoltaic thin film stacks 27121 are flexible, the photovoltaic device 27100 can be attached to many different shapes.

FIG. 2 shows a side cross sectional view of a multi-layered segment of an exemplary photovoltaic thin film stack, generally referred to as 27121. The thin film stack 27121 is flexible. A first outer layer (27210) is disposed on a first inner layer (27211), wherein the first inner layer is an electrode layer. The first outer layer 27210 is a protective layer selected to protect the remainder of the photovoltaic thin film stack 27121 from the environment. The electrode layer may comprise electrodes, transparent electrodes, transparent conducting film or metal networks. Preferably, the electrode layer is optically transparent and electrically conductive.

Continuing with the description of FIG. 2, a second inner layer (27212) connected to the first inner layer (27211), wherein the second inner layer (27212) is an electron transport layer and comprises a coating of metallic or polymeric conducting material. The metallic conducting material may be tin oxide.

A third inner layer (27213) is coated onto the second inner layer (27212) and comprises perovskite-type crystals. In another embodiment of the technology the third inner layer coating further comprises customizable coloration.

A fourth inner layer (27214) coated onto the third inner layer (27213), wherein the fourth inner layer (27214) comprises a coating of a metallic or polymeric conducting material and is a hole transport layer. In one embodiment, the hole transport layer may be 2,2',7,7'-Tetrakis[N,N-di(4-methoxyphenyl)amino]-9,9'-spiro-bifluorene (Spiro-OMeTAD). The hole transport layer (HTL) mainly serves three purposes: First, deposited prior to the electrode, it avoids direct contact of the electrode with the perovskite layer, and therefore increases the selectivity of the contact. This reduces recombination which results in higher open-circuit voltage and a higher luminescence efficiency. Second, the HTL increases the internal quantum efficiency independent of applied voltage and illumination wavelength by reducing (diffusion) losses of charges. Third, due to a smoothing of the perovskite mesoscopic layer the HTL increases the reflectivity of the electrode, which is gold, allowing for a second path of the light through the absorber. Both effects result in an enhancement of the short-circuit current density.

A fifth inner layer (27215) is connected to the fourth inner layer (24214), wherein the fifth inner layer (27215) comprises an electrode layer, which may be a group of electrodes, transparent electrodes, transparent conducting film, or metal networks.

An adherent layer (27216) or coating is adhered to one or both of the outer layers, wherein the outer layers comprise the first outer layer (27210) and the fifth inner layer (27215).

FIG. 3 shows a side cross sectional view of another embodiment of the technology where the photovoltaic thin film stack further comprises a sixth inner layer (27316), optically connected to the fifth inner layer (27215), wherein the sixth inner layer (27316) is an electrode layer and comprises electrodes, transparent electrodes, transparent conducting film or metal networks.

Continuing with the description of FIG. 3, the photovoltaic thin film stack further comprises a seventh inner layer (27317), which is an electron transfer layer that is coated on the sixth inner layer (27316). The electron transfer layer (27317) comprises a coating of metallic or polymeric conducting material. An eight inner layer (27318) is coated onto the seventh inner layer (27317) and is a semi-conductor layer. The semi-conductor layer (27318) comprises perovskite-type crystals. A ninth inner layer (27319) is a hole transfer layer which is coated on the eight inner layer (27318). The hole transfer layer (27319) comprises a coating of a metallic or polymeric conducting material. A tenth inner layer (27320) is connected to the ninth inner layer (27319) and is an electrode layer (27320) which is made of electrodes, transparent electrodes, transparent conducting film or metal networks. In another embodiment of the technology, the transparent electrodes comprise one or more of indium tin oxide, conductive nanowire network, metal mesh, transparent conductive oxides and thin contact wires. The adherent layer (27216) or coating is adhered to one or both of the outer layers, wherein the outer layers comprise the first outer layer (27210) and the tenth inner layer (27320).

One familiar with the art will appreciate that the multi-layered film stack may comprise one or more of flexible, bendable, translucent, transparent, opaque or colored films.

In another embodiment of the technology, the thickness of the device is between one to ten millimeters.

FIG. 4 shows another embodiment of the present technology, in which the semiconductor layer is made of translucent perovskites and the device harvests solar energy from both sides of the photovoltaic thin film stack. FIG. 4 shows the photovoltaic device of the present technology (27100) with multiple translucent photovoltaic thin film stacks (27121, 27122, 27123) collecting, on one side, photovoltaic energy from the sun (27401) and from the other side, photovoltaic energy from an artificial light source such as a lightbulb or a light emitting diode (LED) light (27402). There are support films 27110 on either side of the multiple translucent photovoltaic thin film stacks. One familiar with the art will appreciate that the device can harvest solar energy from both sides of the photovoltaic thin film stack at the same time or at different times, for example in daytime from the sun (27401) and at night-time from the artificial light source (27402).

FIG. 5 is a top view of the flexible photovoltaic thin film device 27100 of the present technology wherein the device 27100 further comprises surface zones (27501 to 27509). The surface zones are electrically connected to the other surface zones via an electrode, wires or trace wires; wherein the electrode is one or more of the first inner layer, the third inner layer, the fourth inner layer and the sixth inner layer as shown in the descriptions above in FIGS. 1 to 4. Blank areas (27520) in the support film 27110 are located between the photovoltaic film stacks e.g. 27127.

Continuing with the description of FIG. 5, the flexible photovoltaic thin film device 27100 of the present technology also has a printed grid (27540) on the support film 27110 that marks the separations between surface zones (27501, 27502). One familiar with the art will appreciate that the printed grid could just be the lack of printed material within a specific layer. For example, if one layer is made of multiple surface zones orange color printed perovskite crystals, the difference between each surface zone will be made visible by the blank areas between surface zones.

Continuing with the description of FIG. 5, following the printed grid, a person may cut the flexible photovoltaic thin film device 27100 with scissors 27150 to make it fit the desired application, for example a person can cut the support film 27110 by following the printed grid without damaging the operation of the device. One familiar with the art will appreciate that when a person needs to cover a specific area where the device is bigger than the area to cover, that person/user has the option to cut to size the photovoltaic device without interrupting the operation of the device which in this case is the conversion of solar energy to electricity or the production of light. This process is possible by leaving areas inside the multi layered thin film where only trace wires that transport electricity or current from surface zones to other surface zones can be cut without damaging the operation. The support film 27110 has an adhesive backing, allowing for it to be attached to a range of surfaces.

FIG. 6 is a top view of the flexible photovoltaic thin film device 27100 of the present technology wherein the master contact points (27601) face one or both sides of the photovoltaic thin film stack 27121. One familiar with the art will appreciate that each trace wire, one carrying the negative and the other one carrying the positive charge from the electrodes, are in different layers, thus, the contact points for the positive or the negative charge are available at the top and bottom of the photovoltaic thin film stack 27121. In another embodiment of the technology, the contact points are connected between layers thus allowing the contact points to be available on either side of the photovoltaic thin film stack 27121. In another embodiment of the technology, the master contact points are one or more of surface mount technology (SMT) or through-hole-technology. One familiar with the art will appreciate that SMT is the method of placing components on a printed circuit board. Here, a calculated amount of solder paste is applied to the printed circuit board (PCB). Then, the pick-and-place machine is used to mount the SMT component onto the board. While Through-hole-technology (THT) involves inserting leads of components into drilled holes in the printed circuit board. Leads can then be soldered onto pads or lands on the solder side of the board, usually with a simple soldering iron by hand or wave soldering process. Soldering a Dual-in-line package (DIP) IC on the PCB is an example of THT.

FIG. 7 is a top view of the flexible photovoltaic thin film device 27100 of the present technology wherein the master contact points (27601) further comprising slave contact points (27602, 27603, 27604), wherein the slave contact points (27602, 27603, 27604) are contact points electrically connected to the master contact points (27601), wherein one or more slave contact points (27602, 27603, 27604) are located in different areas of the device for example at different edges of the surface of the device. One familiar with the art will appreciate that the slave contact points are bridges between other slave contact points and the correspondent master contact point. The idea of having multiple slave contact points is that the user of the device has different areas to make the connection between the contact points and the connectors that will carry the electricity to storage or distribution devices. This further allows for cutting the support film 27110 and the trace wires (27140), while retaining connectivity between the photovoltaic thin film stack and the contact points in each zone.

FIG. 8 shows a side view of a multi-layered segment of a photovoltaic thin film stack that converts solar energy to electricity showing another embodiment of the technology comprising a light emitting inner layer 27800 made of a light emitting material, such as an organic light emitting diode; wherein the light emitting inner layer 27800 is optically connected to other layers of the photovoltaic thin film stack.

FIG. 9 shows a side view of a multi-layered segment of a photovoltaic thin film stack that converts solar energy to electricity showing another embodiment of the technology comprising a sensor layer 27900, wherein the sensor comprises one or more from the group of photosensor, temperature sensors. One familiar with the art will appreciate that the sensors connect via the contact points to complete the circuit or to connect to other electronic components including for example a microprocessor, a computer or a networking device.

In all embodiments, the self adherent photovoltaic thin film device 27100 can be molded to a planar or non-planar shape and can be adhered to an even or uneven surface. Further, it can be cut to conform to a specific shaped-area, a specific size of area, and can be put together in a patch work to cover an area larger than the photovoltaic thin film device 27100.

While example embodiments have been described in connection with what is presently considered to be an example of a possible most practical and/or suitable embodiment, it is to be understood that the descriptions are not to be limited to the disclosed embodiments, but on the contrary, is intended to cover various modifications and equivalent arrangements included within the spirit and scope of the example embodiment. Those skilled in the art will recognize or be able to ascertain using no more than routine experimentation, many equivalents to the specific example embodiments specifically described herein. Such equivalents are intended to be encompassed in the scope of the claims, if appended hereto or subsequently filed.

The invention claimed is:

1. A flexible photovoltaic thin film device, the flexible photovoltaic thin film device comprising: a support film; a plurality of wires, the support film retaining the plurality of wires, each wire of the plurality of wires independently terminating in a contact point; and a plurality of flexible photovoltaic thin film stacks adhered on the support film and each flexible photovoltaic thin stack independently electrically connected to one wire of the plurality of wires, each flexible photovoltaic thin film stack comprising, in order, an outer protective layer, an outer electrode layer, an electron transport layer, a semi-conductor perovskite layer, a hole transport layer, an inner electrode layer and an adherent layer, wherein the plurality of flexible photovoltaic thin film stacks are arranged in an array on the support film.

2. The flexible photovoltaic thin film device of claim 1, further comprising a second support film, the second support film sandwiching the plurality of flexible photovoltaic thin film stack between the second support film and the support film.

3. The flexible photovoltaic thin film device of claim 1, wherein the support film includes an adhesive backing.

4. The flexible photovoltaic thin film device of claim 3, wherein the support film includes a printed grid which divides the support film into a plurality of zones, each zone of the plurality of zones supporting at least one flexible photovoltaic thin film stack.

5. The flexible photovoltaic thin film device of claim 4, wherein the support film is polyimide, polyetheretherketone or transparent conductive polyester film.

6. The flexible photovoltaic thin film device of claim 5, wherein the hole transport layer is 2,2',7,7'-Tetrakis[N,N-di(4-methoxyphenyl)amino]-9,9'-spiro-bifluorene.

7. The flexible photovoltaic thin film device of claim 5, further comprising a sensor layer between the inner electrode layer and the adherent layer, wherein the sensor layer is a photosensor or a temperature sensor.

8. The flexible photovoltaic thin film device of claim 5, further comprising a light emitting layer between the inner electrode layer and the adherent layer.

9. The flexible photovoltaic thin film device of claim 5, wherein the perovskite layer is orange.

10. The flexible photovoltaic thin film device of claim 3, further comprising slave contact points which are in electrical communication with the contact point and the wires and are retained on the support film.

11. The flexible photovoltaic thin film device of claim 7, wherein each flexible photovoltaic thin film stack further comprises, in order, a second inner electrode layer, which is adjacent to and in electrical communication with the inner electrode layer, an electron transport layer, a semi-conductor layer, a hole transport layer, an electrode layer, between the inner electrode layer and the adherent layer.

* * * * *